(12) United States Patent
Comendant

(10) Patent No.: US 9,608,550 B2
(45) Date of Patent: Mar. 28, 2017

(54) LIGHTUP PREVENTION USING MULTI-LAYER CERAMIC FABRICATION TECHNIQUES

(71) Applicant: Lam Research Corporation, Fremont, CA (US)

(72) Inventor: Keith Laurence Comendant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 143 days.

(21) Appl. No.: 14/726,199

(22) Filed: May 29, 2015

(65) Prior Publication Data

US 2016/0352260 A1    Dec. 1, 2016

(51) Int. Cl.
*H02N 13/00* (2006.01)
*H01L 21/683* (2006.01)

(52) U.S. Cl.
CPC ......... *H02N 13/00* (2013.01); *H01L 21/6831* (2013.01); *H01L 21/6833* (2013.01)

(58) Field of Classification Search
CPC .................................................... H02N 13/00
See application file for complete search history.

(56) References Cited

U.S. PATENT DOCUMENTS

| | | | |
|---|---|---|---|
| 5,644,467 A * | 7/1997 | Steger | H01L 21/6833 361/234 |
| 6,033,585 A | 3/2000 | Wicker et al. | |
| 6,072,685 A * | 6/2000 | Herchen | H01L 21/6833 279/128 |
| 6,108,189 A | 8/2000 | Weldon | |
| 8,336,891 B2 * | 12/2012 | Goto | H01L 21/6831 118/728 |
| 8,503,151 B2 | 8/2013 | Comendant | |
| 2010/0321856 A1 * | 12/2010 | Peitzsch | H01L 21/6831 361/234 |
| 2011/0024044 A1 * | 2/2011 | Nagakubo | H01J 37/3244 156/345.33 |
| 2012/0247678 A1 * | 10/2012 | Takahashi | H01J 37/32009 156/345.44 |
| 2013/0315795 A1 * | 11/2013 | Bera | H01J 37/321 422/310 |

* cited by examiner

*Primary Examiner* — Scott Bauer
(74) *Attorney, Agent, or Firm* — Beyer Law Group LLP

(57) ABSTRACT

In accordance with this disclosure, there are provided several inventions, including an electrostatic chuck apparatus comprising multiple layers with cutouts that form a labyrinth structure which defined a path for cooling or heating gas. The structure prevents particles from accelerating such that they form unwanted lightup in the gas flow path.

18 Claims, 6 Drawing Sheets

Section A-A

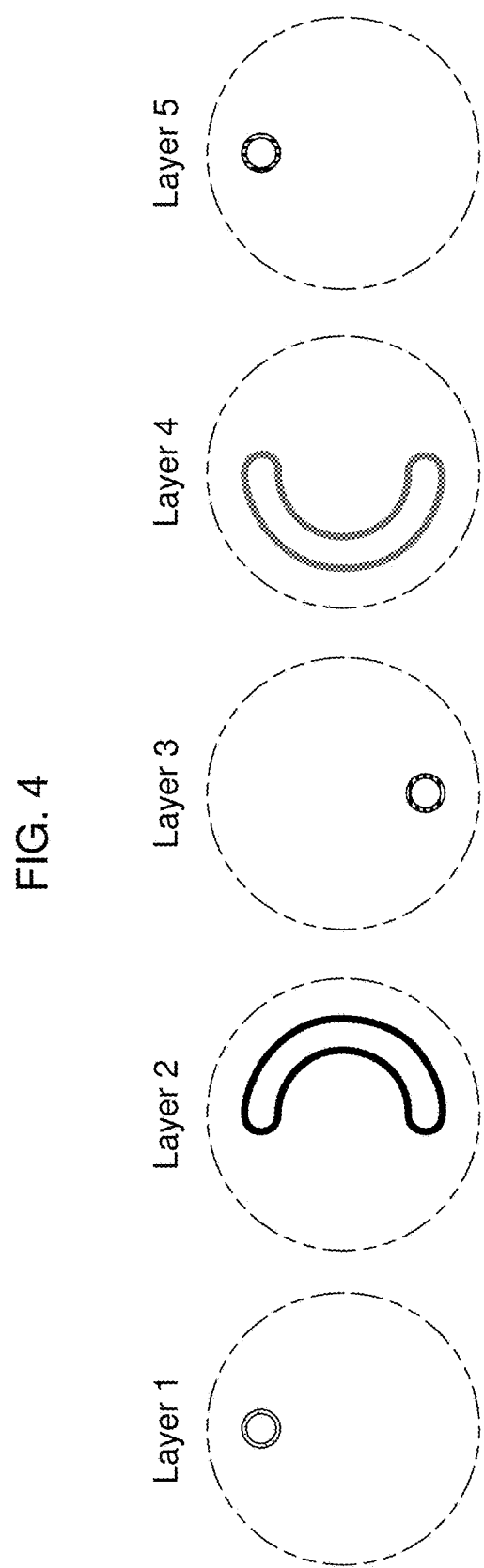

Section A-A

LIGHTUP PREVENTION USING MULTI-LAYER CERAMIC FABRICATION TECHNIQUES

BACKGROUND

The present invention relates to preventing lightup in holes of an electrostatic chuck ("ESC") feeding the backside of a wafer during processing or cleaning operations.

In semiconductor material processing facilities, plasma processing chambers are often used for operations such as etching and deposition. Usually, a semiconductor wafer is placed on an ESC where it is held during the processing. An ESC may have holes for admitting gasses to the clamped side of the wafer to facilitate cooling or heating of the wafer, or to purge hole features in the ESC during plasma cleaning of the ESC surface.

Where low pressure gasses are present within ESC holes, and where electric voltage gradients are present, a form of glow discharge, or arcing may occur, which may be detrimental to the process. U.S. Pat. No. 6,033,585 discusses avoidance of lightup in gas distribution holes within an ESC by providing a circuitous path for the distributed gasses, wherein lightup is prevented. U.S. Pat. No. 8,503,151 discusses the use of a dielectric arrestor insert to prevent arcing and lightup.

As applied to gas holes in electrostatic chucks, U.S. Pat. No. 6,108,189 purports to address the issue of arcing and lightup by coating the inside of holes in the electrostatic chuck with a dielectric material. However, this does not reduce the path length of gas molecules within the holes. It also discusses using a dielectric layer at the opening of the holes in the electrostatic chuck facing the wafer. A problem with using a single channel through a top dielectric layer is that depending on the design, this top layer may be thick enough so that a single channel through it might cause lightup.

The U.S. Pat. No. 6,108,189 patent describes another solution of using a porous plug of dielectric material in the top layer of the electrostatic chuck, so that gas takes a tortuous path through the hole in the electrostatic chuck. Many such configurations, however, can leave gaps which have the potential to lead to lightup. In addition, such porous plugs may be difficult and complicated to manufacture and align.

There is a need for a better system and method for preventing lightup in an electrostatic chuck, which is effective, eliminates long stretches of open space where particles may be accelerated, and is easy to manufacture in light of current designs for electrostatic chucks.

SUMMARY

Several inventive embodiments are described herein. In one embodiment, an electrostatic chuck for use in a plasma processing chamber may comprise a base through which passes a gas inlet. Above the base, constituting in this example the top surface of the electrostatic chuck, there may be a wafer ceramic for placement underneath a wafer for plasma processing. This wafer ceramic may comprise a plurality of ceramic layers, wherein each ceramic layer may contain one or more cutouts which may be partially or totally through each layer, the cutouts forming a labyrinth in direct or indirect fluid communication with the gas inlet. At any position within the labyrinth, the line of sight to a surface within the wafer ceramic layer may be less than about 4 mm in any direction.

In another embodiment, the electrostatic chuck described above may further comprise a plug opening which may constitute a passageway from the gas opening to the labyrinth, and a porous ceramic plug within the plug opening.

In another embodiment, an electrostatic chuck may be formed by steps comprising: providing the base through which passes the gas inlet; providing the plurality of ceramic layers; forming the cutouts within each of the ceramic layers; and joining the ceramic layers, such that the ceramic layers form the wafer ceramic, for example by co-sintering, bonding with glass frit, the use of an adhesive, or other means.

Another embodiment described herein is an insert for an electrostatic chuck in a plasma processing chamber. This insert may comprise a plurality of ceramic layers, wherein each ceramic layer contains one or more cutouts, the cutouts forming a labyrinth in direct or indirect fluid communication with the gas inlet. At any position within the labyrinth, the line of sight to a surface within the wafer ceramic layer may be less than about 4 mm in any direction. A cutout in the top ceramic layer may form a top opening to the insert, and a cutout in the bottom ceramic layer may form a bottom opening to the insert. In addition, the insert may be sized and configured to fit securely within an insert opening within the electrostatic chuck, so as to provide a fluid path from a gas inlet in the electrostatic chuck below the bottom opening, then through the bottom opening, then through the labyrinth, and then through the top opening. In one embodiment, the above insert may be coated on one or more sides with an electrically insulating material, such that the coating does not obstruct the top opening or the bottom opening.

Another embodiment described herein is a method of placing the insert of claim 15 within the electrostatic chuck. This method may include providing an electrostatic chuck with the insert opening located in its top surface, and inserting the insert into the insert opening, such that the bottom opening aligns with the gas inlet of the electrostatic chuck. In one example, the insert may be bonded to the insert opening with a bonding material.

These and other features of the present inventions will be described in more detail below in the detailed description and in conjunction with the following figures.

BRIEF DESCRIPTION OF THE DRAWINGS

The disclosed inventions are illustrated by way of example, and not by way of limitation, in the figures of the accompanying drawings and in which like reference numerals refer to similar elements and in which:

FIG. 4 is a top view of layers 1-5 of an example set of labyrinthine channels.

DETAILED DESCRIPTION

Inventions will now be described in detail with reference to a few of the embodiments thereof as illustrated in the accompanying drawings. In the following description, specific details are set forth in order to provide a thorough understanding of the present invention. However, the present invention may be practiced without some or all of these specific details, and the disclosure encompasses modifications which may be made in accordance with the knowledge generally available within this field of technology. Well-known process steps and/or structures have not been described in detail in order to not unnecessarily obscure the present disclosure.

Figure 1:
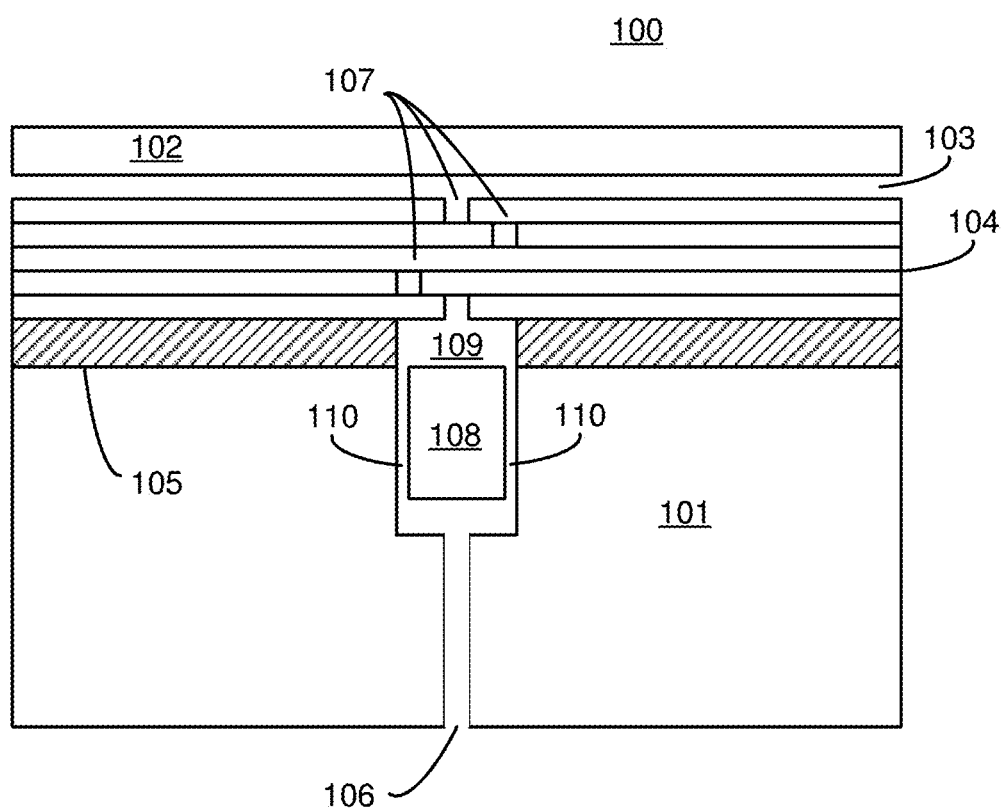
FIG. 1 is a schematic cross-sectional view of part of an electrostatic chuck.

Described herein are apparatuses and methods for preventing lightup in an electrostatic chuck. One embodiment is shown in FIG. 1, which is a schematic cross-sectional view of part of an electrostatic chuck. The electrostatic chuck may be part of a plasma processing chamber which includes an open chamber area 100 in which plasma may be formed. The electrostatic chuck may include a base plate 101. The base plate may be connected to a wafer ceramic 104 by an adhesive 105. The adhesive may in one embodiment be silicone-based. The wafer ceramic may in one embodiment be 1-6 mm in thickness, or more preferably 3-5 mm. On the wafer ceramic may be placed a wafer 102 for processing.

When the wafer is placed on the chuck, there may be a small gap 103 between the wafer ceramic and the wafer. In one example, a gap may be on the order of about 1-13 microns wide, but various designs may have different gap widths. When gas cooling of the backside of the wafer is used, this gap may be maintained at a higher pressure than the surrounding chamber area 100. The electrostatic force pressing down on the wafer may in this case balance, or exceed, the upward force due to this gas pressure in the gap, thus keeping the wafer on the chuck and keeping it flat during processing, facilitating temperature control of the wafer.

In some prior art designs, a small (about 0.5 mm) tube was used to convey a gas, such as helium, to the gap 103 under the backside of the wafer. However, as such a tube becomes longer, it provides a long path for molecules and ions to accelerate from the voltage gradients and cause lightup or arcing. The gap could be partly expanded and filled with a porous plug, but such a plug may be less than optimal because of difficulty in assembling the top layers of the electrostatic chuck, including aligning the plug and ensuring there are no unwanted channels around the plug.

In one embodiment of a new design, a wafer ceramic 104 may be formed by stacking thin ceramic layers. In this example, there are five layers, but there may be more or less, such as three layers, 10 layers, 14 layers, or higher. These layers may in one embodiment be co-sintered to form a single ceramic piece, or otherwise joined or bonded; for example, joined with glass frit as a bonding material, or using an adhesive. These thin layers may have cutouts 107. In one embodiment, these cutouts may be arranged so that they are staggered in each layer, such that the culmination of the ceramic build results in a hollow, channel feature that will conduct gas through the channel, but in a maze-like fashion that would reduce or prevent lightup from occurring. A cutout may be a feature cut through an entire layer, or alternatively may be a feature cut through only part of a layer. The labyrinthine channels should preferably feature no single straight path through which particles may accelerate to the point of causing lightup, and the various turns may force the particles to collide with the channel walls, thus preventing lightup. Across its area, the wafer ceramic may have any number of such labyrinthine passageway systems to the underside of the wafer. FIG. 1 shows just one such system of passageways, but others on the same chuck may be of a similar configuration. Cutouts 107 may be formed in many ways, including by laser cutting, grinding, drilling, or additive manufacturing of the layers.

In one embodiment, the labyrinthine channels may be fed by a tube 106 from below, ultimately connected to a gas source such as helium. Optionally, this tube may have other lightup prevention measures within it. The deeper the channel goes into the bulk of the chuck, the less problem there will most likely be with lightup. For example, the path through the chuck to the wafer ceramic may have one or more cutouts for a porous plug 108. In one embodiment, the plug may be formed of porous sintered alumina. Depending on how the plug 108 is set within the cutout, there may be channels 110 around the porous plug, or some volume 109 above the porous plug. These channels and open spaces may in some embodiments be filled with another material, or in another embodiment the plug may be raised above the base plate 101 such that the volume 109 is minimized. In some embodiments, the porous plug 108 may be coated on the sides with alumina or some other ceramic, or insulating material such as a polymer, preferably leaving the top and bottom surfaces uncoated. This can serve to insulate the areas of the plug that may cause arcing.

Figure 2:
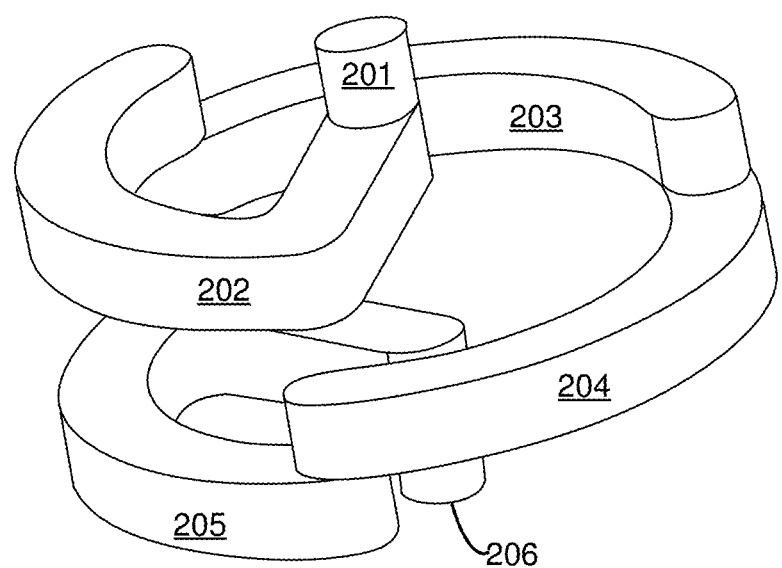
FIG. 2 is a perspective view of an illustrative set of labyrinthine channels within a wafer ceramic.

FIG. 2 is a perspective view of an illustrative set of labyrinthine channels within a wafer ceramic. The open channels are depicted here as if they were solid, but within the wafer ceramic they will be open channels surrounded by solid material. In this particular example, the channels are formed within six layers 201-206, respectively. Each layer forms a curved path. Preferably, the maximum straight line that any particle could take within each of these curved paths will be less than about 0.5 mm; however, longer paths may be used, such as 2 mm, 4 mm, or 6 mm. In this example, gas particles may enter the wafer ceramic through layer 206, move up to the channel in layer 205, and then enter each successive layer 204, 203, 202, and then finally 201 where gas may exit to gas gap below the wafer.

Figure 3A:
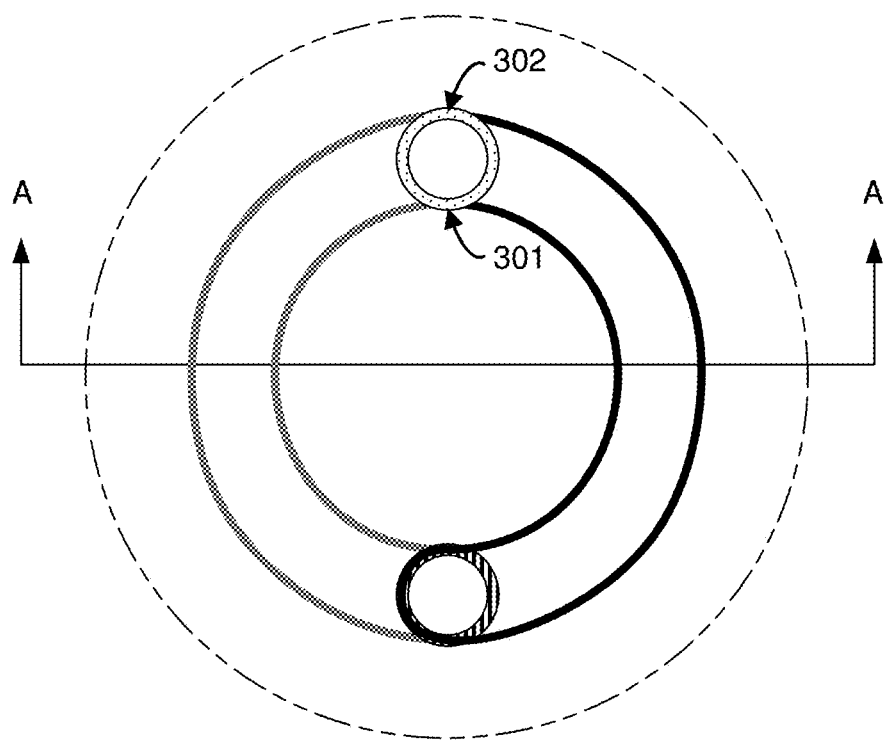
FIG. 3A is a top view of an example set of labyrinthine channels, and 3B is a cross-sectional view along axis A-A.
Figure 3B:
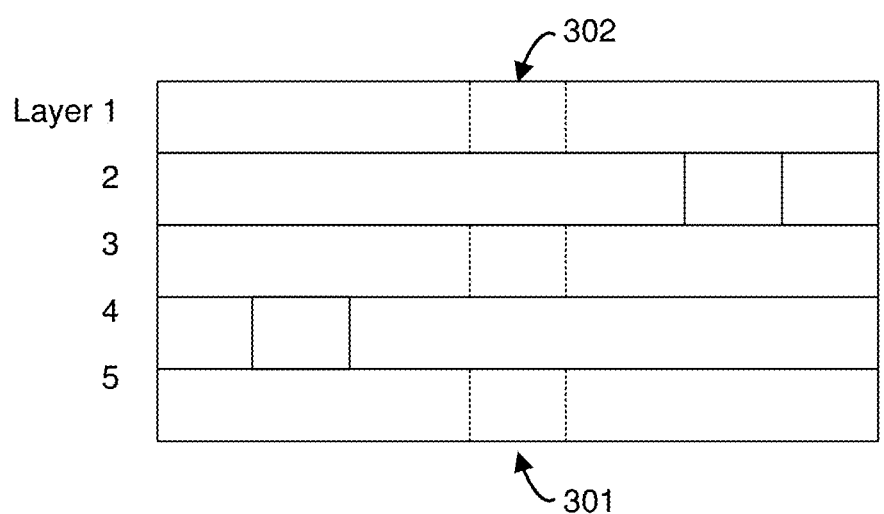

FIG. 3A is a top view of another example set of labyrinthine channels, and 3B is a cross-sectional view along axis A-A. In this embodiment, the channels form semicircle patterns through five layers. Gas may enter layer 5 from an entry hole 301 below, and then progress through the layers along a labyrinthine path to an exit hole 302 from layer 1. Each of these layers is depicted in more detail in FIG. 4. Layers 2 and 4 in this example contain semicircle channels, while layers 1, 3, and 5 contain holes to allow passage through the layer in the upward direction.

Figure 5A:
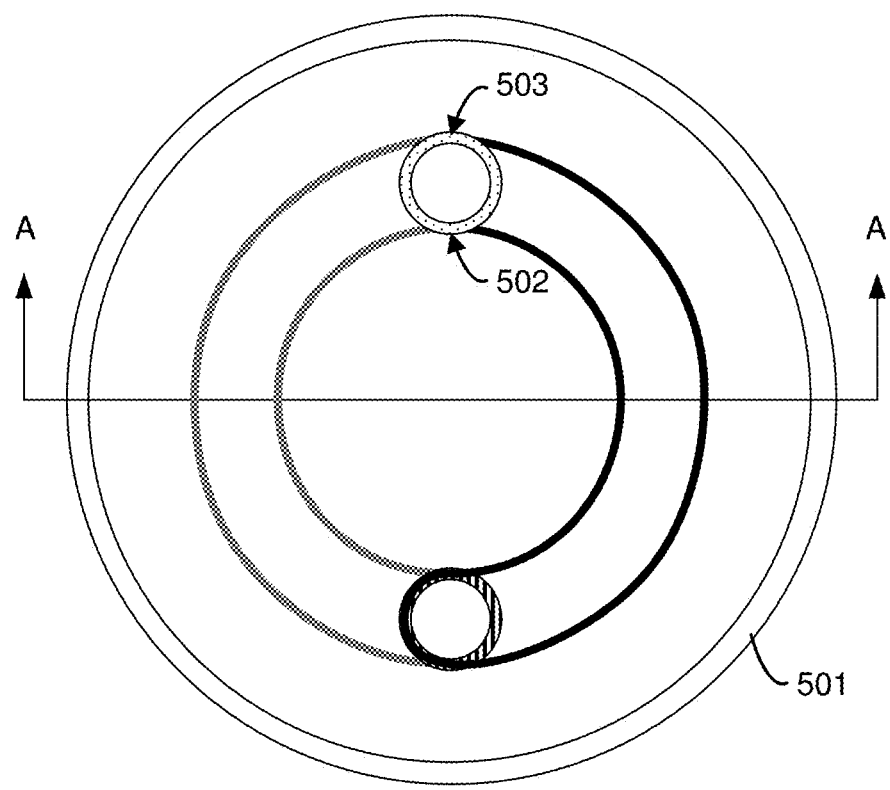
FIG. 5A is a top view of an example set of labyrinthine channels in an insert, and 5B is a cross-sectional view along axis A-A.
Figure 5B:
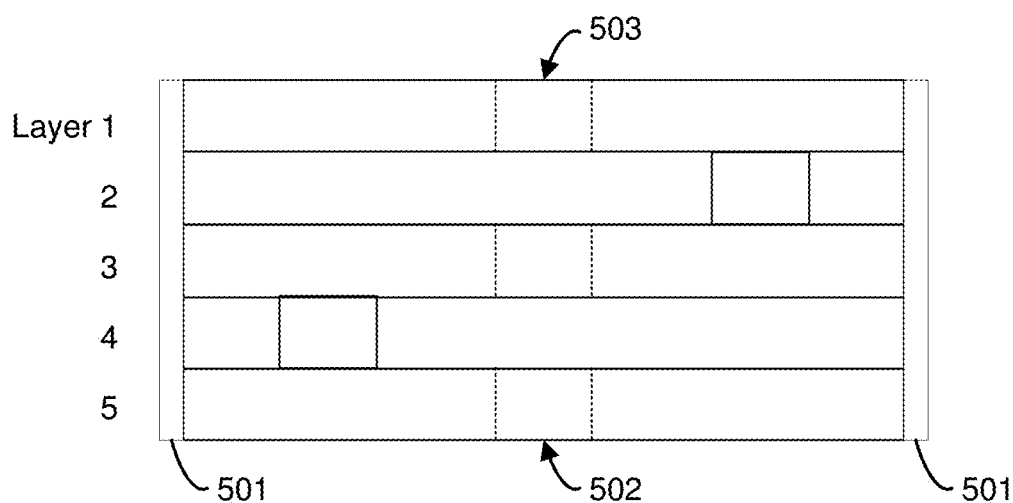

In another embodiment, instead of a maze-like gas path formed by openings in a wafer ceramic at the top of the electrostatic chuck, a labyrinthine path may be formed within a separate piece to be used as an insert into an opening in the electrostatic chuck, an example of which is illustrated in FIGS. 5A (top view) and 5B (cross-sectional view along section A-A). Such an insert could, for example, be a replacement for a porous plug and fulfill a similar role. It may be made by a similar process to a layered wafer ceramic as described above, such as by co-sintering of separate layers or bonding by class frit or an adhesive. Each layer may have cutouts (through an entire layer or through part of a layer) to define a labyrinth path. Each channel section, including enough solid material to contain the channel, may in one embodiment be cut from a larger ceramic piece, or the layers may be fabricated at their final size, and bonded together. In one embodiment, such an insert may be coated by an electrically-insulating material 501. This coating may in one embodiment be placed on the sides of the insert, excluding the top and bottom so as not to obstruct the bottom and top openings 502 and 503, respectively.

The cutout piece may in one embodiment be made using a core drill, or other ceramic fabrication techniques known by those skilled in the art of ceramic fabrication. The cutout piece may then be bonded into a mating hole feature in a ceramic or baseplate that would carry the gas.

In another embodiment, each layer of an insert may be fabricated to near the net size required. Each of the layers may be fired or otherwise bonded together, and then a final grind may be conducted to reduce the insert to the required size.

Figure 6:
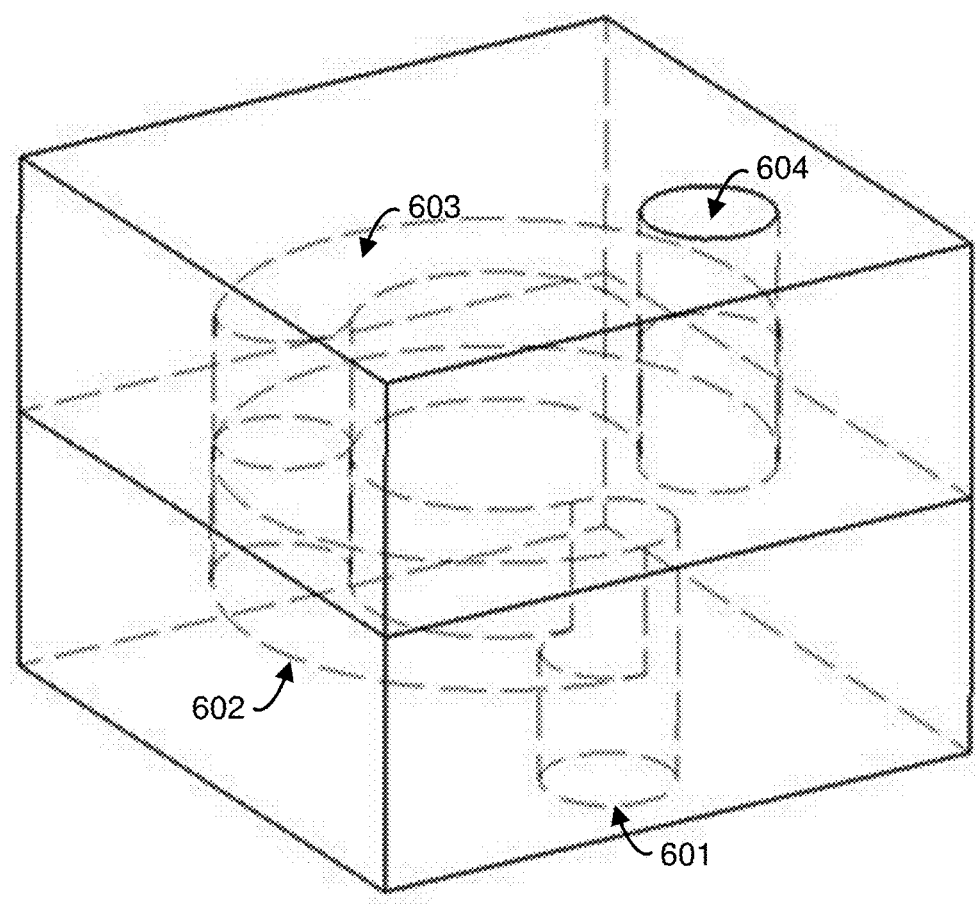
FIG. 6 is a perspective view of an illustrative set of labyrinthine channels within two layers of a wafer ceramic, in which some of the cutouts are only partially excavated through the layers.

In one embodiment, shown in FIG. 6, a labyrinthine pattern may be formed using cutouts that do not extend entirely through each layer, but rather only through part of a layer. For example, a single layer may contain a bore 601 and a channel 602 excavated on one side, such that the bore 601 and channel 602 are connected. In this example, gas may enter bore 601, travel through channel 602 and then to channel 603, and exit from bore 604. In another example, one side of a layer may contain a channel in one direction, while the opposite side of the layer may contain a channel in another direction, where the two channels meet at some point, thus forming a connection between the two.

While inventions have been described in terms of several preferred embodiments, there are alterations, permutations, and various substitute equivalents, which fall within the scope of this invention. There are many alternative ways of implementing the methods and apparatuses disclosed herein. It is therefore intended that the following appended claims be interpreted as including all such alterations, permutations, and various substitute equivalents as fall within the true spirit and scope of the present invention.

What is claimed is:

1. An electrostatic chuck for use in a plasma processing chamber, comprising:
    a base through which passes a gas inlet;
    above the base, constituting the top surface of the electrostatic chuck, a wafer ceramic for placement underneath a wafer for plasma processing, comprising a plurality of ceramic layers, wherein each ceramic layer contains one or more cutouts, the cutouts forming a labyrinth in direct or indirect fluid communication with the gas inlet, wherein at any position within the labyrinth, the line of sight to a surface within the wafer ceramic layer is less than about 4 mm in any direction.

2. The electrostatic chuck of claim 1, wherein the number of layers is at least 3.

3. The electrostatic chuck of claim 2, wherein the number of layers is at least 10.

4. The electrostatic chuck of claim 3, wherein the number of layers is at least 14.

5. The electrostatic chuck of claim 1, wherein the line of sight to a surface within the wafer ceramic layer is less than about 2 mm in any direction.

6. The electrostatic chuck of claim 5, wherein the line of sight to a surface within the wafer ceramic layer is less than about 1 mm in any direction.

7. The electrostatic chuck of claim 6, wherein the line of sight to a surface within the wafer ceramic layer is less than about 0.5 mm in any direction.

8. The electrostatic chuck of claim 1, wherein the cutouts for each of the ceramic layers are selected from the group consisting of a semicircular channel and a bore, wherein each bore in one layer aligns with an end of a semicircular channel in an adjacent layer, thus forming a gas path that alternates between bore and circular layer.

9. The electrostatic chuck of claim 1, further comprising:
    a plug opening which constitutes a passageway from the gas opening to the labyrinth; and
    a porous ceramic plug within the plug opening.

10. The electrostatic chuck of claim 1, wherein at least one of the one or more cutouts is an excavation of a layer that passes only partially through the layer for at least a portion of the cutout.

11. A method of forming the electrostatic chuck of claim 1, comprising:
    providing the base through which passes the gas inlet;
    providing the plurality of ceramic layers;
    forming the cutouts within each of the ceramic layers; and
    joining the ceramic layers, such that the ceramic layers form the wafer ceramic.

12. The method of claim 11, wherein the ceramic layers are joined by co-sintering.

13. The method of claim 11, wherein the ceramic layers are joined by bonding with glass frit.

14. The method of claim 11, wherein the ceramic layers are joined by an adhesive.

15. An insert for an electrostatic chuck in a plasma processing chamber, comprising:
    a plurality of ceramic layers, wherein each ceramic layer contains one or more cutouts, the cutouts forming a labyrinth in direct or indirect fluid communication with a gas inlet, wherein at any position within the labyrinth, the line of sight to a surface within the wafer ceramic layer is less than about 4 mm in any direction;
    wherein a cutout in the top ceramic layer forms a top opening to the insert;
    wherein a cutout in the bottom ceramic layer forms a bottom opening to the insert; and
    wherein the insert is sized and configured to fit securely within an insert opening within the electrostatic chuck, so as to provide a fluid path from the gas inlet in the electrostatic chuck below the bottom opening, then through the bottom opening, then through the labyrinth, and then through the top opening.

16. The insert of claim 15, wherein the insert is coated on one or more sides with an electrically insulating material, such that the coating does not obstruct the top opening or the bottom opening.

17. A method of placing the insert of claim 15 within the electrostatic chuck, comprising:
    providing an electrostatic chuck with the insert opening located in its top surface; and
    inserting the insert into the insert opening, such that the bottom opening aligns with the gas inlet of the electrostatic chuck.

18. The method of claim 17, further comprising bonding the insert to the insert opening with a bonding material.

* * * * *